United States Patent
Moussavi

(10) Patent No.: US 7,812,678 B2
(45) Date of Patent: Oct. 12, 2010

(54) DIGITAL CALIBRATION TECHNIQUES FOR SEGMENTED CAPACITOR ARRAYS

(75) Inventor: Mohsen Moussavi, Kanata (CA)

(73) Assignee: Altera Corporation, San Jose, CA (US)

( * ) Notice: Subject to any disclaimer, the term of this patent is extended or adjusted under 35 U.S.C. 154(b) by 69 days.

(21) Appl. No.: 12/333,275

(22) Filed: Dec. 11, 2008

(65) Prior Publication Data

US 2010/0148881 A1    Jun. 17, 2010

(51) Int. Cl.
    *G01R 23/00*      (2006.01)
    *H03L 7/06*      (2006.01)
    *H03L 7/099*      (2006.01)

(52) U.S. Cl. ................ 331/25; 331/1 A; 331/36 C; 331/44; 331/179

(58) Field of Classification Search ............... 331/1 A, 331/8, 16–18, 25, 34, 36 C, 44, 177 R, 177 V, 331/179
See application file for complete search history.

(56) References Cited

U.S. PATENT DOCUMENTS 6,707,403 B1 *  3/2004  Hurrell ............... 341/120

2003/0133522 A1   7/2003  Staszewski et al.

OTHER PUBLICATIONS

A. V. Rylyakov et al., "A Wide Power-Supply Range (0.5V-to-1.3V) Wide Tuning Range (500MHz-to-8 GHz) All-Static CMOS AD PLL in 65nm SOI," 2007 IEEE International Solid-State Circuits Conference / Session 9 / Clocking / 9.1, Feb. 13, 2007, pp. 172-173.
Robert Bogdan Staszewski et al., "All-Digital TX Frequency Synthesizer and Discrete-Time Receiver for Bluetooth Radio in 130-nm CMOS," IEEE Journal of Solid-State Circuits, vol. 39, No. 12, Dec. 2004, pp. 2278-2291.
Unpublished U.S. Appl. No. 12/163,808, filed Jun. 27, 2008, by Moussavi, et al.
Unpublished U.S. Appl. No. 12/168,811, filed Jul. 7, 2008, by Moussavi.
Unpublished U.S. Appl. No. 12/272,266, filed Nov. 17, 2008, by William W. Bereza et al.

* cited by examiner

*Primary Examiner*—David Mis
(74) *Attorney, Agent, or Firm*—Steven J. Cahill

(57) ABSTRACT

An apparatus includes phase detection circuitry that generates control signals in response to an input clock signal and a feedback clock signal. The apparatus also includes a clock signal generation circuit that includes fine and coarse capacitors. The clock signal generation circuit changes a capacitance of the capacitors that are affecting the output clock signal in response to a change in the control signals. The apparatus also includes measurement circuitry that determines a calibration number of the fine capacitors having a combined capacitance that most closely matches a capacitance of one of the coarse capacitors.

20 Claims, 8 Drawing Sheets

US 7,812,678 B2

DIGITAL CALIBRATION TECHNIQUES FOR SEGMENTED CAPACITOR ARRAYS

BACKGROUND OF THE INVENTION

The present invention relates to electronic circuits, and more particularly, to digital calibration techniques for segmented capacitor arrays.

Digital locked loops, such as digital phase-locked loops and digital delay-locked loops, can generate one or more periodic output clock signals.

BRIEF SUMMARY OF THE INVENTION

According to some embodiments of the present invention, an apparatus includes phase detection circuitry that generates control signals in response to an input clock signal and a feedback clock signal. The apparatus also includes a clock signal generation circuit that includes fine and coarse capacitors. The clock signal generation circuit changes a capacitance of the capacitors that are affecting the output clock signal in response to a change in the control signals. The apparatus also includes measurement circuitry that determines a calibration number of the fine capacitors having a combined capacitance that most closely matches a capacitance of one of the coarse capacitors.

Various objects, features, and advantages of the present invention will become apparent upon consideration of the following detailed description and the accompanying drawings.

DETAILED DESCRIPTION OF THE INVENTION

Figure 1:
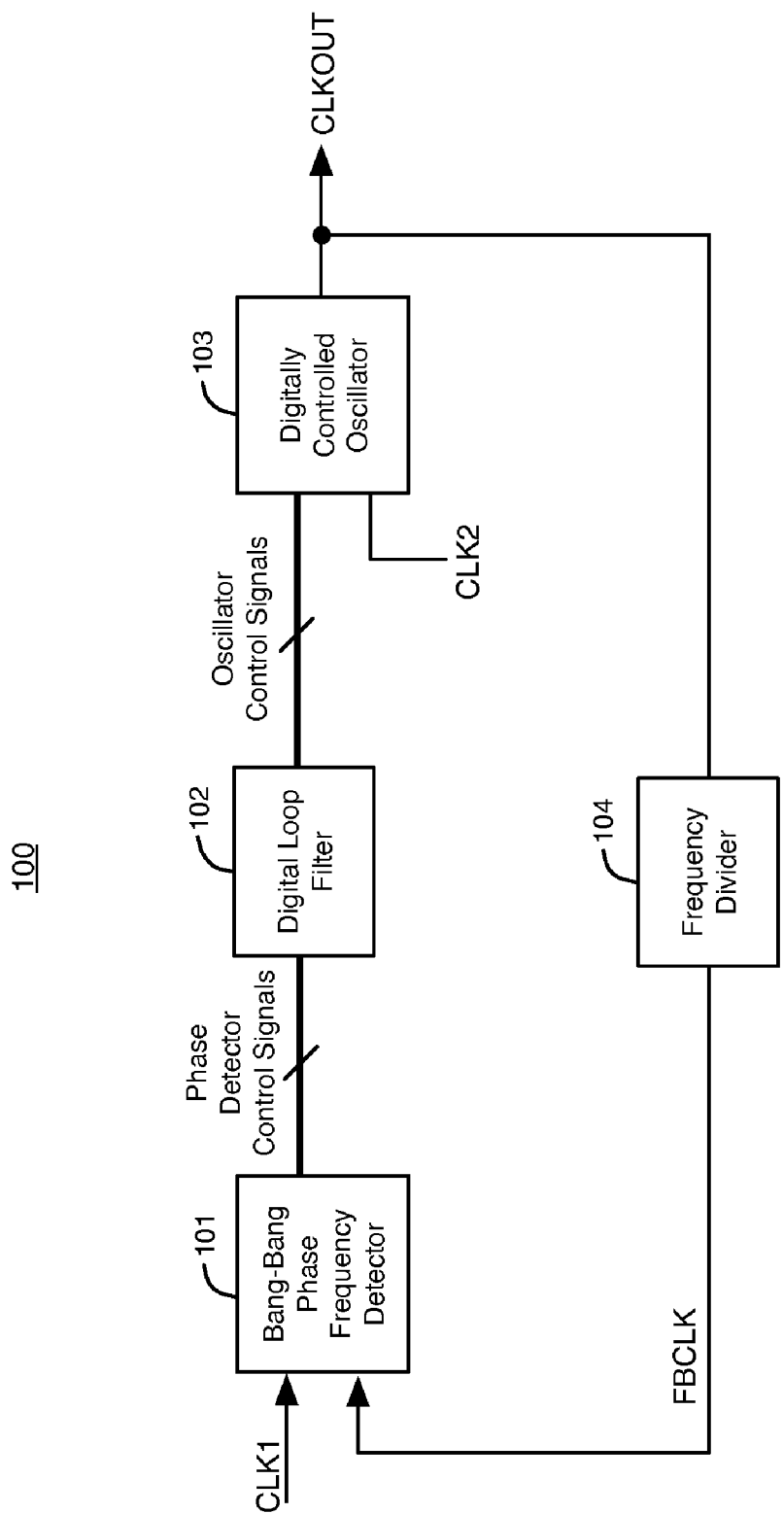
FIG. 1 illustrates an example of a digital phase-locked loop (PLL), according to an embodiment of the present invention.

FIG. 1 illustrates an example of digital phase-locked loop (PLL) circuit 100, according to an embodiment of the present invention. PLL 100 includes bang-bang phase frequency detector (BBPFD) circuit 101, digital loop filter 102, digitally controlled oscillator (DCO) 103, and frequency divider circuit 104. PLL 100 is typically fabricated on an integrated circuit, such as a programmable logic integrated circuit or an application specific integrated circuit (ASIC). Programmable logic integrated circuits include field programmable gate arrays (FPGAs) and programmable logic devices (PLDs).

Bang-bang phase frequency detector 101 compares the phase of an input reference clock signal CLK1 to the phase of a feedback clock signal FBCLK generated by frequency divider circuit 104. Frequency divider circuit 104 is a counter circuit that divides the frequency of a periodic output clock signal CLKOUT from DCO 103 to generate the frequency of the feedback clock signal FBCLK. Phase frequency detector 101 generates digital phase detector control signals having logic states that are indicative of any phase and/or frequency difference between clock signals CLK1 and FBCLK. Phase frequency detector 101 varies the logic states of the digital phase detector control signals in response to changes in the difference between the phase and/or frequency of CLK1 and FBCLK.

Digital loop filter 102 receives the phase detector control signals from phase frequency detector 101 and generates oscillator control signals that are transmitted to input terminals of digitally controlled oscillator (DCO) 103. DCO 103 also receives an input clock signal CLK2. Clock signals CLK1 and CLK2 in FIG. 1 can be the same periodic signal having the same frequency or two different periodic signals having different frequencies or different phases. DCO 103 generates a periodic output clock signal CLKOUT in response to the oscillator control signals and clock signal CLK2. DCO 103 varies the phase and the frequency of clock signal CLKOUT in response to changes in the oscillator control signals.

Figure 2:
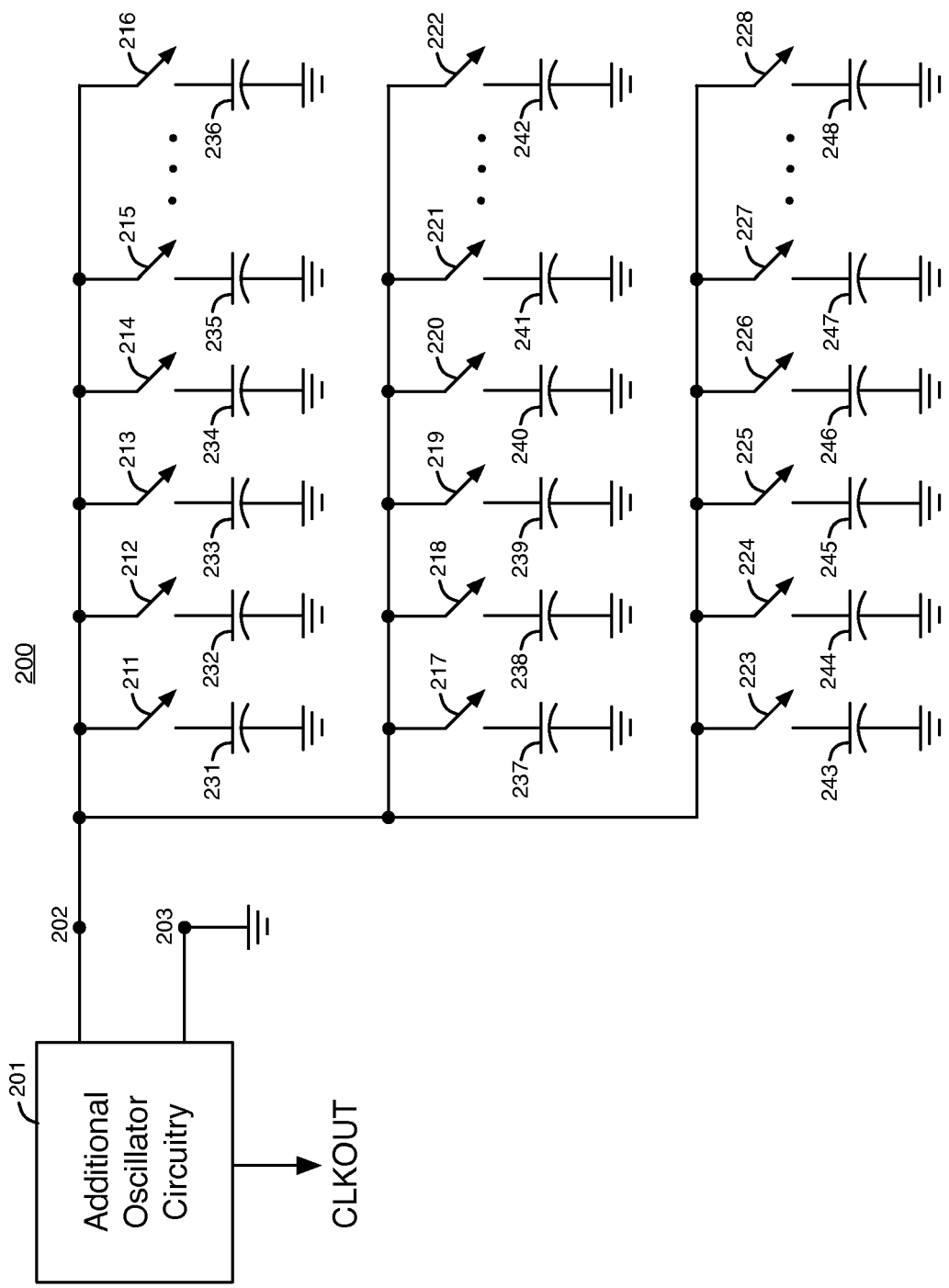
FIG. 2 illustrates an example of a digitally controlled oscillator (DCO), according to an embodiment of the present invention.

FIG. 2 illustrates an example of a digitally controlled oscillator (DCO), according to an embodiment of the present invention. DCO 200 shown in FIG. 2 is an example of DCO 103 that is part of digital PLL 100 shown in FIG. 1. DCO 200 includes switches 211-228 and capacitors 231-248. Each of the switches 211-228 can be implemented, e.g., by one or more field-effect transistors that function as switching transistors.

A first terminal of each of switches 211-228 is coupled to additional oscillator circuitry 201 at node 202. A second terminal of each switch 211-228 is coupled to a first terminal of a corresponding capacitor 231-248, as shown in FIG. 2. The second terminal of each capacitor 231-248 is coupled to a terminal that receives a ground voltage. Node 203 of additional oscillator circuitry 201 is also coupled to a terminal that receives the ground voltage. Each capacitor 231-248 is coupled in series with one of the switches 211-228. DCO 200 can include any suitable number of capacitors that are each coupled in series with a switch. 18 capacitors and 18 switches are shown in FIG. 2 merely as an example. DCO 200 can, e.g., have hundreds or thousands of capacitors and the same number of switches.

The conductive states of switches 211-228 are controlled by the logic states of digital control signals. The digital control signals are not shown in FIG. 2 to simplify the drawing. The digital control signals that control the conductive states of switches 211-228 are the oscillator control signals shown in FIG. 1 that are generated by digital loop filter 102. When the oscillator control signals close all of switches 211-228 (i.e., switches 211-228 are conductive), capacitors 231-248 are coupled together in parallel with each other. Opening a switch refers to changing the conductive state of the switch so that the switch blocks current flow through the switch. Closing a switch refers to changing the conductive state of the switch so that the switch allows current to flow through the switch.

DCO 200 generates one or more oscillating digital output clock signals including CLKOUT. The output clock signals of DCO 200 can be generated at node 202 and other nodes in DCO 200. The conductive states of switches 211-228 vary in response to changes in the digital control signals from filter 102. When PLL 100 varies the logic states of the digital control signals, the total capacitance between nodes 202 and 203 changes to vary the frequency and phase of the output clock signals generated by oscillator 200. PLL 100 increases the total capacitance between nodes 202 and 203 to decrease the frequency of the output clock signals of DCO 200. PLL 100 decreases the total capacitance between nodes 202 and 203 to increase the frequency of the output clock signals. DCO 200 functions as an analog-to-digital converter that converts the digital control signals from filter 102 into periodic output clock signals having a variable frequency.

DCO 200 can be any suitable type of oscillator. For example, DCO 200 can be a ring oscillator, a crystal oscillator, or an LC oscillator having an inductor and one or more capacitors or varactors. Additional oscillator circuitry 201 contains the circuitry needed to implement the selected oscillator architecture. For example, additional oscillator circuitry 201 can include a set of delay circuits that are coupled together in a loop to implement a ring oscillator. In this embodiment, node 202 is a node in the delay loop of delay circuits. As another example, additional oscillator circuitry 201 can include an inductor, one or more varactors, and switching transistors that are coupled to form an LC oscillator. One of the output clock signals of DCO 200 can be generated at node 202.

DCO 200 has a segmented capacitor architecture, because capacitors 237-248 each have a capacitance value that is greater than the capacitance value of each capacitor 231-236. Capacitors 231-236 ideally each have the same fine capacitance value $C_F$, and capacitors 237-248 ideally each have the same coarse capacitance value $C_C$. The ratio of the capacitance of each capacitor 237-248 to the capacitance of each capacitor 231-236 (i.e., $C_C$:$C_F$) is ideally a fixed ratio.

In DCO 200, capacitors 237-248 generate coarse capacitance steps, and capacitors 231-236 interpolate between the coarse capacitance steps with fine capacitance steps. The coarse capacitance steps generated by capacitors 237-248 refer to the change in the capacitance between nodes 202 and 203 that is generated each time an additional switch 217-228 is opened or closed. The fine capacitance steps generated by capacitors 231-236 refer to the change in the capacitance between nodes 202 and 203 that is generated each time an additional switch 211-216 is opened or closed. Because each of capacitors 231-236 ideally has the same capacitance $C_F$, each of the fine capacitance steps corresponds to the same amount of change in the capacitance between nodes 202 and 203. Because each of capacitors 237-248 ideally has the same capacitance $C_C$, each of the coarse capacitance steps corresponds to the same amount of change in the capacitance between nodes 202 and 203. Capacitors 231-236 are referred to as fine capacitors, and capacitors 237-248 are referred to as coarse capacitors.

When all of the switches 211-216, etc. are closed, all of the fine capacitors 231-236, etc. are coupled to node 202. In order to cause an additional decrease in the frequency of the output clock signals of DCO 200, a carry signal (not shown) is asserted. In response to the carry signal being asserted, one of switches 217-228 is closed to couple one of the coarse capacitors 237-248 to node 202. As a result, at least one coarse capacitor 237-248 is coupled to 202.

Ideally, a capacitance of a predetermined number N of the fine capacitors 231-236 equals a capacitance of each one of the coarse capacitors 237-248. N ideally equals $C_C/C_F$. When the carry signal is asserted, at least one of switches 211-216 remains closed, and an N−1 number of switches 211-216 are opened.

When all of the switches 211-216, etc. are open, all of the fine capacitors 231-236, etc. are decoupled from node 202. In order to cause an additional increase in the frequency of the output clock signals of DCO 200, a borrow signal (not shown) is asserted. In response to the borrow signal being asserted, one of switches 217-228 is opened to decouple one of the coarse capacitors 237-248 from node 202. As a result, at least one coarse capacitor 237-248 is decoupled from node 202. Also, when the borrow signal is asserted, at least one of switches 211-216 remains open, and an N−1 number of switches 211-216 are closed.

By using a segmented architecture of fine and coarse capacitors, DCO 200 can generate a K×L number of different capacitance values between nodes 202 and 203 using only K+L capacitors. K is the number of fine capacitors 231-236, etc., and L is the number of coarse capacitors 237-248, etc. If all of the capacitors 231-248 instead had the same capacitance, then a K×L number of capacitors are required to generate K×L capacitance values. Thus, using the fine and coarse capacitor arrays shown in FIG. 2 can allow a substantial reduction in the number of capacitors in the DCO.

Typically, the coarse capacitors 237-248 are not made of many similar fine capacitors. Creating several fine capacitors on a chip to create a single coarse capacitor requires a relatively large die area. Therefore, the coarse and fine capacitors usually have different topologies (e.g., different shapes) in order to achieve a significant reduction in the amount of die area required to fabricate the capacitors on an integrated circuit.

Typically, each of the fine capacitors 231-236 has substantially the same capacitance value, and each of the coarse capacitors 237-248 has substantially the same capacitance value. There may be a small random mismatch between two or more of the fine capacitors, and there may be a small random mismatch between two or more of the coarse capacitors.

However, there may be a significant difference between the average capacitance value of the fine capacitors 231-236 and the average capacitance value of the coarse capacitors 237-248 in DCO 200. The difference between the average capacitance of the fine capacitors and the average capacitance of the coarse capacitors is referred to as a systematic mismatch. Modeling inaccuracies, variations in the photolithography process between different integrated circuit dies, the small sizes of the capacitors, and the different topologies of the fine and coarse capacitors are usually among the causes of the systematic mismatch. The systematic mismatch between the fine capacitors and the coarse capacitors can be relatively large in terms of percentage of the capacitance of each capacitor, if the capacitors have small capacitance values.

The systematic mismatch may cause a significant differential non-linearity in the transfer characteristics of the capacitor arrays. Each capacitance step that occurs when one of the switches 211-228 is closed has the potential of causing a differential non-linearity if there is a capacitance mismatch. For the fine capacitors, the differential non-linearity is the difference between the capacitance step that occurs when a particular fine capacitor is coupled to or decoupled from node 202 and the average value of the fine capacitance step at node 202. For the coarse capacitors, the differential non-linearity is the difference between the capacitance step that occurs when a particular coarse capacitor is coupled to or decoupled from node 202 and the average value of the coarse capacitance step at node 202. Differential nonlinearities can cause large discontinuities at the transitions from the fine capacitors to the coarse capacitors when the carry or borrow signal is asserted. These discontinuities can make the DCO useless in closed-loop systems.

Modeling inaccuracies, process variations, and different capacitor topologies may cause the ratio of the capacitance of the coarse capacitors 237-248 to the capacitance of the fine capacitors 231-236 to vary with respect to a design ratio. For example, mismatches between the fine and coarse capacitors may cause the capacitance ratio of $C_C$:$C_F$ to vary from a design ratio of 100:1 to equal 117:1 or 88:1.

According to an embodiment of the present invention, the number N of fine capacitors 231-236 that when coupled together in parallel have a combined capacitance value that most closely equals the capacitance of a single coarse capacitor 237-248 is measured. This number N is referred to as the calibration number. When the calibration number N is determined, the calibration number N is stored in storage circuitry (e.g., a digital controller or register). Then, the calibration number N is used to determine how many fine capacitors 231-236 are coupled to node 202 and decoupled from node 202 each time that the carry or borrow signal is asserted and the number of coarse capacitors 237-248 coupled to node 202 changes. The calibration number N can be determined separately in each integrated circuit die that contains DCO 200. The calibration number N is used to maintain the continuity (i.e., the differential linearity) of the transfer characteristic of capacitors 231-248 in DCO 200.

For example, when an increase in capacitance of $C_F$ at node 202 is intended, and all of the fine capacitors 231-236, etc. are coupled to node 202, a coarse capacitor 237-248 is coupled to node 202 in response to the carry signal being asserted, and N-1 fine capacitors 231-236 are decoupled from node 202, where N is the calibration number. When a decrease in capacitance of $C_F$ at node 202 is intended, and all of the fine capacitors 231-236, etc. are decoupled from node 202, a coarse capacitor 237-248 is decoupled from node 202 in response to the borrow signal being asserted, and N-1 fine capacitors 231-236 are coupled to node 202, where N is the calibration number.

If the coarse capacitors have identical designs, then the capacitance values of the coarse capacitors are expected to be nearly the same. Also, because the coarse capacitors are larger than the fine capacitors, it is more likely that the coarse capacitors will have nearly the same capacitance values. If each of the coarse capacitors in DCO 200 has nearly the same capacitance value, then only one calibration number N is stored for the entire array of coarse capacitors.

However, if the coarse capacitors in DCO 200 have significantly different capacitance values, then different values for the calibration number N can be measured to determine the correct ratio between each of the coarse capacitors and a number of fine capacitors. Generating and storing calibration numbers for each coarse capacitor may require a large amount of additional storage and processing circuitry.

It may be difficult to directly measure the capacitances of the fine and coarse capacitors in DCO 200. However, the capacitances of the fine and the coarse capacitors in DCO 200 can be determined indirectly to calculate the calibration number N. The capacitances of the fine and the coarse capacitors in DCO 200 can be determined indirectly by measuring the changes in the frequency of output clock signal CLKOUT of DCO 200 that are caused by changes in the conductive states of switches 211-228. The frequency measurement is usually very accurate.

A frequency measurement can, for example, involve coupling only a selected number J of the fine capacitors to node 202, decoupling all of the coarse capacitors from node 202, and then counting the number of periods P1 of the output clock signal CLKOUT of DCO 200 during a fixed time. Subsequently, all the fine capacitors are decoupled from node 202, and only one coarse capacitor is coupled to node 202. Then, the number of periods P2 in the output clock signal CLKOUT of DCO 200 is counted over an equal time period. The difference between the number of periods P1 and P2 divided by the fixed measurement time is the frequency difference.

If the number of periods P1 and P2 counted are equal, then J fine capacitors have exactly the same capacitance as one coarse capacitor. If the number of periods P1 and P2 counted are not equal, the degree and direction of mismatch between J fine capacitors and one coarse capacitor is proportional to the difference between the counts P1 and P2. Because the frequency of the DCO output clock signals is inversely proportional to the capacitance between nodes 202 and 203, more periods counted in a fixed time period indicate a smaller capacitance, and less periods counted in the same fixed time period indicate a larger capacitance.

One frequency measurement technique for determining the calibration number N involves calculating several values for the frequency difference. Each value for the frequency difference is calculated when a different number of fine capacitors are coupled to node 202. For example, the frequency difference can be determined when 50 fine capacitors are coupled to node 202. Then, the frequency difference can be determined when 51 fine capacitors are coupled to node 202. Then, the frequency difference can be determined when 52 fine capacitors are coupled to node 202. Then, the frequency difference can be determined when 53 fine capacitors are coupled to node 202. According to this technique, the frequency difference can be determined when several additional numbers of fine capacitors are coupled to node 202 (e.g., 54-70 fine capacitors to generate a total of 21 frequency difference values).

During each measurement of the frequency difference, the difference between the number of periods counted during the fine capacitor measurement and the number of periods counted when only a single coarse capacitor is coupled to node 202 is determined. The number of fine capacitors coupled to node 202 that generates the smallest value for the frequency difference among the frequency difference measurements equals the calibration number N. Thus, the number of periods counted while an N number of fine capacitors are coupled to node 202 that most closely matches the number of periods counted while a single coarse capacitor is coupled to node 202 indicates the number N of fine capacitors that most closely matches the capacitance of a single coarse capacitor.

Figure 3A:
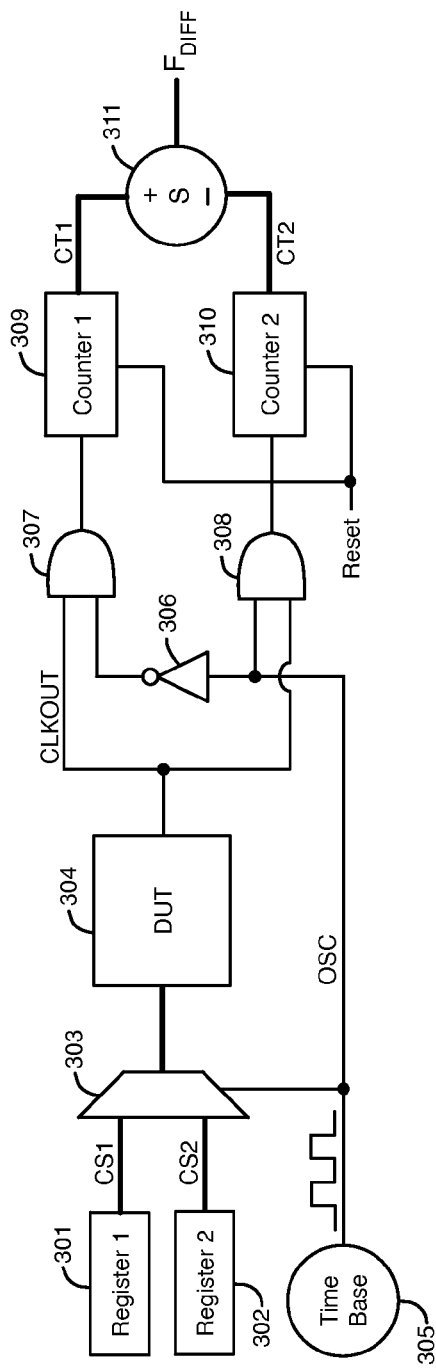
FIG. 3A illustrates measurement circuitry that can measure a difference between two frequencies of a device in an alternating interleaved manner, according to an embodiment of the present invention.
Figure 3B:
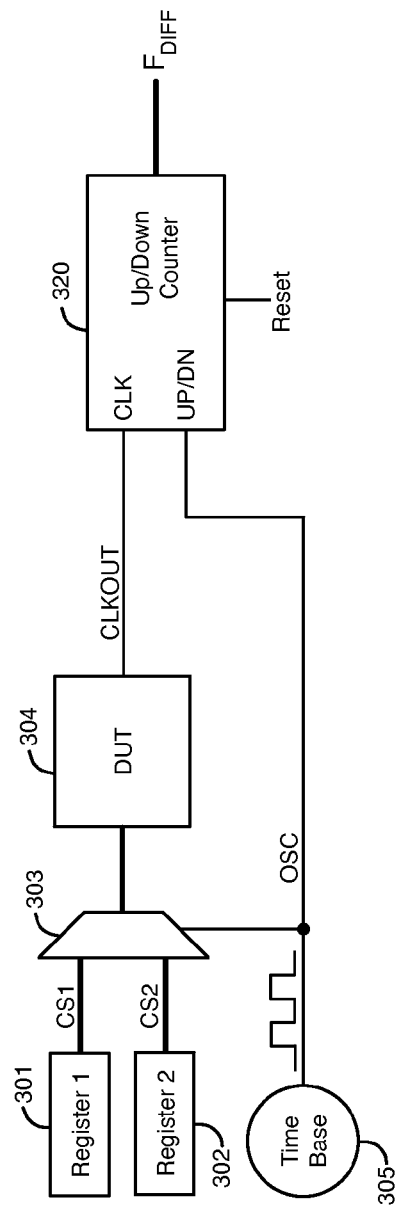
FIG. 3B illustrates measurement circuitry that can measure a difference between two frequencies of device in an alternating interleaved manner, according to another embodiment of the present invention.

FIGS. 3A and 3B illustrate two examples of measurement circuitry that can be used to determine the number of fine capacitors that have the closest combined capacitance to a single coarse capacitor, according to embodiments of the present invention. The circuits shown in FIGS. 3A-3B measure the difference between a first frequency of an output clock signal CLKOUT of DCO 200 when only a selected number of fine capacitors are coupled to node 202 and a second frequency of the output clock signal CLKOUT when only one coarse capacitor is coupled to node 202. The frequency difference indicates the difference in the number of periods of the output clock signal that are counted over a time period. The difference in the number of periods is proportional to the difference between the combined capacitance of the selected number of fine capacitors and the capacitance of the coarse capacitor. The time period used to measure the first frequency is the same as the time period used to measure the second frequency.

The time period for the frequency measurement can be derived from any oscillation source other than the DCO being tested. The oscillation source is referred to as the time base 305. Time base 305 does not need to be accurate, because the frequency measurements are relative to each other. Because the measurements are designed to determine the minimum count difference, the absolute accuracy of each count by itself does not affect the result. Time base 305 may have its own phase noise. The phase noise of time base 305 may be effectively reduced by the counting methods of FIG. 3A-3B, which also reduce the noise in CLKOUT generated by DCO 200.

The presence of large phase noise at low frequencies (i.e. frequency wander) can cause inaccuracies in the measurements of small frequency differences. The amount of frequency wander from one measurement to the next may be larger than the frequency difference that is the measurement target. For example, if the phase noise at low frequencies rises at a rate of 30 decibels per decade, increasing the measurement time does not improve the accuracy of the measurement. According to an embodiment, the effect of frequency wander is significantly reduced or eliminated by measuring two frequencies of CLKOUT in an alternating interleaved manner as described below with respect to FIGS. 3A-3B.

The measurement circuitry of FIG. 3A includes registers 301 and 302, time base circuit 305, multiplexer circuit 303, device under test (DUT) 304, inverter 306, AND gate 307, AND gate 308, counter circuits 309 and 310, and subtract circuit 311. DUT 304 is the digitally controlled oscillator (DCO) circuit 200.

First digital control signals CS1 (i.e., a first control word) are stored in register 301, and second digital control signals CS2 (i.e., a second control word) are stored in register 302. The first digital control signals CS1 are transmitted in parallel from register 301 to first inputs of multiplexer 303, and the second digital control signals CS2 are transmitted in parallel from register 302 to second inputs of multiplexer 303. Multiplexer 303 has a select input terminal that receives an oscillating digital signal OSC from time base 305.

Multiplexer 303 transmits the first control signals CS1 in parallel to DUT 304/DCO 200 when OSC is in a logic low state. The first control signals CS1 control the conductive states of switches 211-228 to cause a selected number of the fine capacitors 231-236 to be coupled to node 202, and none of the coarse capacitors 237-248 to be coupled to node 202. When the switches 211-228 are controlled by the first control signals CS1, DUT 304/DCO 200 generates an output clock signal CLKOUT having a first frequency that is determined by the number of fine capacitors coupled to node 202.

Also, when OSC is in a logic low state, the output signal of inverter 306 is in a logic high state, causing AND gate 307 to transmit the logic states of the CLKOUT signal to a count input terminal of counter circuit 309. Counter circuit 309 counts the number of periods that occur in CLKOUT when OSC is low. A period of CLKOUT is also referred to as a cycle of CLKOUT. The binary value of the output count signals CT1 of counter circuit 309 equals the number of periods that were counted in CLKOUT while OSC was in a logic low state. When OSC is low, AND gate 308 does not transmit the CLKOUT signal to counter 310.

Multiplexer 303 transmits the second control signals CS2 in parallel to DUT 304/DCO 200 when OSC is in a logic high state. The second digital control signals CS2 control the conductive states of switches 211-228 to cause only a single coarse capacitor (one of capacitors 237-248) to be coupled to node 202, and none of the fine capacitors 231-236 to be coupled to node 202. When the switches 211-228 are controlled by the second control signals CS2, DUT 304/DCO 200 generates an output clock signal CLKOUT having a second frequency that is determined by the coarse capacitor coupled to node 202.

Also, when OSC is in a logic high state, the output signal of inverter 306 is in a logic low state, preventing AND gate 307 from transmitting the CLKOUT signal to counter circuit 309. AND gate 308 transmits the logic states of CLKOUT to a count input terminal of counter 310 when OSC is in a logic high state. Counter circuit 310 counts the number of periods that occur in CLKOUT when OSC is in a logic high state. The binary value of the output count signals CT2 of counter circuit 310 equals the number of periods that were counted in CLKOUT while OSC was in a logic high state.

The output count signals CT1 and CT2 of counters 309 and 310 are initially reset to zero binary values in response to a Reset signal. After the output count signals of counters 309 and 310 are reset, the output count signals CT1 and CT2 of counters 309 and 310 are allowed to increase in response to each received period of CLKOUT for several cycles of the OSC signal. As the OSC signal varies between logic high and low states, the frequency of the CLKOUT signal varies between the first and the second frequencies that are determined by the control signals CS1 and CS2. At the same time, the corresponding AND gates 307 and 308 alternately allow counters 309 and 310 to count the frequency of CLKOUT, respectively, as OSC varies between logic high and low states over several cycles of OSC. Signal OSC has a 50% duty cycle, which causes the time period for measuring the first frequency of CLKOUT when OSC is in a logic low state to be the same as the time period for measuring the second frequency of CLKOUT when OSC is in a logic high state. OSC varies between logic high and low states in each period of OSC, and each of the counters 309 and 310 count several periods of CLKOUT during each period of OSC.

The binary value of count signals CT1 increases by one during each period of CLKOUT when OSC is in a logic low state. The binary value of count signals CT2 increases by one during each period of CLKOUT when OSC is in a logic high state. Subtract circuit 311 subtracts the binary value of count signals CT2 from the binary value of count signals CT1 to generate digital output signals having a binary value that equals $F_{DIFF}$. $F_{DIFF}$ equals the difference between the first frequency and the second frequency. The technique described above with respect to FIG. 3A is repeated several times to generate several different values of $F_{DIFF}$. During each measurement of $F_{DIFF}$ performed using the circuitry of FIG. 3A, a different number of fine capacitors are coupled to node 202 to generate different values of the first frequency. Each frequency measurement for the fine capacitors is subtracted from a frequency measurement for the single coarse capacitor over the same time period to generate $F_{DIFF}$. Among the several measurements of $F_{DIFF}$, the number of fine capacitors coupled to node 202 that generates the minimum value of $F_{DIFF}$ equals the calibration number N.

The measurement circuitry of FIG. 3A measures the first and second frequencies of CLKOUT in an interleaved manner, because OSC is an oscillating periodic signal, and counters 309 and 310 each count periods of CLKOUT in each period of OSC. If the frequency of OSC is significantly larger than the low frequency wander, the interleaved measurements of the first and the second frequencies performed by the circuitry of FIG. 3A effectively attenuate the frequency wander of both CLKOUT and the OSC signal. As a result, the effects of frequency wander on the outcome of the frequency measurements are significantly reduced or eliminated.

The frequency difference between the first and the second frequencies can be determined over any desired number of cycles of the OSC signal generated by time base 305. If a more accurate value of the frequency difference $F_{DIFF}$ is required, the first and the second frequencies are counted over a larger number of cycles of OSC to increase the accuracy of $F_{DIFF}$. The period of OSC is preferably much longer than the period of CLKOUT (e.g., 1000 times longer) so that counters 309 and 310 can count several periods of CLKOUT in each half period of OSC.

The period of the OSC signal generated by time base 305 should be large enough to allow sufficient fluctuations caused by noise in each frequency count (during half a period of the OSC signal) in order to avoid quantization limitations. For example, if the count of periods in CLKOUT in each half period of OSC is expected to be about 1000, the noise (i.e., the frequency wander of both the OSC and CLKOUT signals) should be much larger than 1 in that count. For example, the noise may have an RMS value of 10.

The measurement circuitry of FIG. 3B includes registers 301 and 302, time base circuit 305, multiplexer circuit 303, device under test (DUT) 304, and up/down counter circuit 320. Registers 301 and 302, time base circuit 305, multiplexer circuit 303, and DUT 304 function as described above with respect to FIG. 3A. DUT 304 is DCO 200. When signal OSC is in a logic low state, multiplexer 303 transmits first control signals CS1 from register 301 to DUT 304/DCO 200, and in response, DCO 200 generates a first frequency in CLKOUT that is determined by a selected number of fine capacitors coupled to node 202. When signal OSC is in a logic high state, multiplexer 303 transmits second control signals CS2 from register 302 to DUT 304/DCO 200, and in response, DCO 200 generates a second frequency in CLKOUT that is determined by a single coarse capacitor being coupled to node 202.

Up/down counter 320 receives the CLKOUT clock signal from DUT 304/DCO 200 at its CLK input terminal. Up/down counter 320 receives the OSC signal at its UP/DN input terminal. Up/down counter 320 generates digital output count signals having a binary value equal to $F_{DIFF}$.

Initially, the binary value of the count signals $F_{DIFF}$ is reset to zero in response to the Reset signal being asserted. Subsequently, when the OSC signal is in a logic high state during one-half of each cycle of OSC, up/down counter 320 increases the binary value of the count signals $F_{DIFF}$ by one in each period of output clock signal CLKOUT from DCO 200. When the OSC signal is in a logic low state during another half of each cycle of OSC, up/down counter 320 decreases the binary value of the count signals $F_{DIFF}$ by one in each period of output clock signal CLKOUT from DCO 200. After several periods of signal OSC, the binary value of the output count signals $F_{DIFF}$ indicates the difference between the first frequency of CLKOUT and the second frequency of CLKOUT.

The difference $F_{DIFF}$ between the first and the second frequencies is proportional to the difference between the combined capacitance of the selected number of fine capacitors used to generate the first frequency and the capacitance of the coarse capacitor used to generate the second frequency. The technique described above with respect to FIG. 3B is repeated several times to measure the frequency of CLKOUT. During each frequency measurement, a different number of fine capacitors are coupled to node 202. Each frequency measurement for the fine capacitors is subtracted from a frequency measurement for the single coarse capacitor over the same time period to generate $F_{DIFF}$. Among the several measurements of $F_{DIFF}$, the number of fine capacitors coupled to node 202 that generates the minimum value of $F_{DIFF}$ equals the calibration number N.

The worst-case error for the calibration number N is 50% of the capacitance of one fine capacitor using the technique of FIG. 3A or 3B. For example, if the calibration number is calculated to be 30 using the technique of FIG. 3A or 3B, then the correct number of the fine capacitors that equal the capacitance of one coarse capacitor is at most 30.5:1 and at least 29.5:1.

Figure 4:
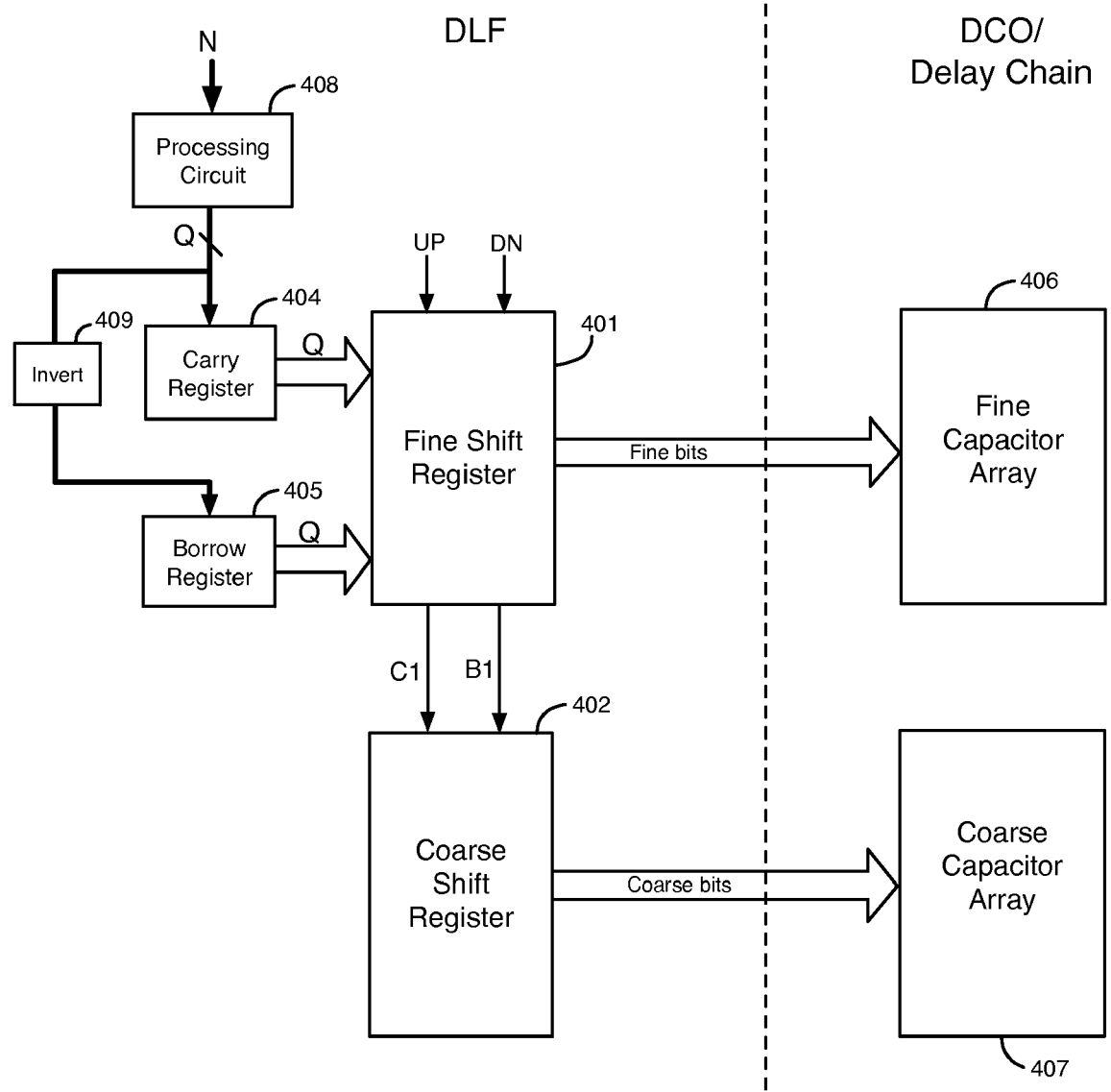
FIG. 4 illustrates portions of a digital loop filter and portions of a digitally controlled oscillator in a digital phase-locked loop (PLL) or a delay chain in a delay-locked loop (DLL), according to an embodiment of the present invention.

After the calibration number N has been determined using, e.g., the technique of FIG. 3A or 3B, the calibration number N is processed in digital loop filter 102, as described below with respect to FIG. 4. FIG. 4 illustrates portions of a digital loop filter and portions of a digitally controlled oscillator in a digital phase-locked loop (PLL) or a delay chain in a delay-locked loop (DLL), according to an embodiment of the present invention. Digital loop filter 102 in PLL 100 includes fine shift register 401, coarse shift register 402, carry register 404, borrow register 405, processing circuit 408, and invert circuit 409. Fine capacitor array 406 and coarse capacitor array 407 are part of DCO 103/200, or alternatively, are part of a delay chain in a digital delay-locked loop, as described in further detail below with respect to FIGS. 5-6. The detailed circuit architecture of FIG. 4 is merely an example that is not intended to limit the scope of the present invention.

Capacitor array 406 includes several fine capacitors, such as capacitors 231-236. Each of the fine capacitors is coupled to a switch, such as switches 211-216. The switches are coupled to node 202. Each of the fine capacitors in capacitor array 406 have the same or about the same capacitance.

Capacitor array 407 includes several coarse capacitors, such as capacitors 237-248. Each of the coarse capacitors is coupled to a switch, such as switches 217-228. The switches are coupled to node 202. Each of the coarse capacitors in capacitor array 407 have the same or about the same capacitance.

In one embodiment, each of the shift registers 401-402 stores digital bits in logic high states (i.e., one bits) and/or digital bits in logic low states (i.e., zero bits) in a set of serially coupled flip-flops. The bits stored in registers 401-402 may be encoded using any desired technique. For example, the bits stored in registers 401-402 may be binary encoded bits or thermometer-encoded bits. In a thermometer-encoded technique, the one bits in each shift register are stored in sequence, and the zero bits in each shift register are also stored in sequence. The following description of the detailed operation of FIG. 4 assumes that a thermometer-encoding technique is used to encode the bits stored in registers 401-402. The thermometer-encoding technique is described herein for the purpose of illustration and is not intended to limit the scope of the present invention.

The bits stored in shift register 401 are referred to as the fine bits. The fine bits stored in register 401 are transmitted to capacitor array 406 in parallel through a signal bus. The fine bits control the switches 211-216, etc. that are coupled to the fine capacitors in fine capacitor array 406. Each fine bit controls one switch. The logic state of each fine bit determines the conductive state of one of the switches in array 406.

In the thermometer-encoded embodiment, each one bit stored in shift register 401 closes a switch, and each zero bit stored in shift register 401 opens a switch. When a switch is closed, an additional capacitor in array 406 is coupled to node 202, causing the frequency of output clock signal CLKOUT to decrease. When a switch is opened, an additional capacitor in array 406 is decoupled from node 202, causing the frequency of output clock signal CLKOUT to increase.

The bits stored in register 402 are referred to as the coarse bits. The coarse bits stored in coarse shift register 402 are transmitted to array 407 in parallel through a signal bus. The coarse bits control switches that are coupled to the coarse capacitors in array 407. The logic state of each coarse bit controls the conductive state of one of the switches coupled to a coarse capacitor in array 407. The coarse bits in register 402 determine how many of the coarse capacitors in capacitor array 407 are coupled to node 202 through the switches.

Prior to the operation of PLL 100, the measurement technique of FIG. 3A or 3B (or another measurement technique) is performed to determine the frequency difference $F_{DIFF}$ between the measured first and second frequencies of CLKOUT when several different numbers of fine capacitors are coupled to node 202, as described above. The number of fine capacitors coupled to node 202 that generates the smallest frequency difference $F_{DIFF}$ is selected to be the calibration number N. The calibration number N is transmitted to processing circuit 408, e.g., embodied in digital signals having logic states equal to the logic states of the subset of the first control signals CS1 that controlled the switches coupled to the fine capacitors when generating the minimum value of $F_{DIFF}$.

Processing circuit 408 generates a Q number of digital output signals. Q equals the maximum number of bits that can be stored in fine shift register 401. Q also equals the number of fine capacitors in capacitor array 406. Processing circuit 408 subtracts one from N to generate a (N−1) number of zero (0) bits (i.e., signals in logic low states) and a (Q−N+1) number of one (1) bits (i.e., signals in logic high states). Processing circuit 408 generates a (N−1) number of zero bits among the Q digital output signals and a (Q−N+1) number of one bits among the Q digital output signals.

The Q digital output signals of processing circuit 408 are transmitted in parallel to carry register 404 and to invert circuit 409. The Q digital output signals of processing circuit 408 are stored in flip-flops in carry register 404. An N−1 number of zero bits are stored in register 404, and a (Q−N+1) number of one bits are stored in register 404. The Q digital signals stored in register 404 are transmitted to register 401 in parallel.

Invert circuit 409 inverts the logic states of the Q digital output signals of processing circuit 408 to generate Q inverted digital signals. Each one bit among the Q digital output signals is converted to a zero bit, and each zero bit among the Q digital output signals is converted to a one bit. The Q inverted digital signals are transmitted in parallel to borrow register 405. The Q inverted digital signals are stored in flip-flops in borrow register 405. An N−1 number of one bits are stored in borrow register 405, and a (Q−N+1) number of zero bits are stored in borrow register 405. The Q inverted digital signals stored in register 405 are transmitted in parallel to register 401. In the thermometer-encoded embodiment, the one bits are stored in sequence next to each other in registers 404-405, and the zero bits are stored in sequence next to each other in resisters 404-405 (e.g., 000000011111).

Fine shift register 401 receives UP and DN input signals that are generated in response to the phase detector control signals from BBPFD 101. The UP and DN signals are generated in digital loop filter 102 in response to the phase detector control signals. Digital loop filter 102 asserts the UP signal when the phase detector control signals indicate that the frequency of the feedback clock signal FBCLK is greater than the frequency of input clock signal CLK1 or the phase of FBCLK is ahead of the phase of CLK1. Digital loop filter 102 asserts the DN signal when the phase detector control signals indicate that the frequency of the feedback clock signal FBCLK is less than the frequency of the input clock signal CLK1 or the phase of FBCLK is behind the phase of CLK1.

When the UP signal is asserted, an additional one bit is serially shifted into fine shift register 401 in each clock period of a clock signal (not shown). The number of one bits (i.e., bits in logic high states) stored in fine shift register 401 increases by one, and the number of zero bits (i.e., bits in logic low states) stored in fine shift register 401 decreases by one during each period of the clock signal that the UP signal is asserted. Increasing the number of one bits stored in register 401 by one causes an additional fine capacitor to be coupled to node 202, increasing the capacitance at node 202. When the capacitance at node 202 increases, the phases and the frequencies of the output clock signal CLKOUT and the feedback signal FBCLK decrease (i.e., logic state transitions occur later in time).

If the UP signal continues to be asserted, more one bits are serially shifted into register 401. If the UP signal continues to be asserted after all of the bits stored in register 401 are one bits, fine shift register 401 asserts the C1 carry signal. The C1 carry signal is transmitted to register 402. Asserting the C1 signal causes a one bit to be serially shifted into coarse shift register 402. The one bit shifted into register 402 closes a switch in capacitor array 407 coupling an additional coarse capacitor to node 202.

When the C1 signal is asserted, fine shift register 401 loads the Q bits that are transmitted from carry register 404, and then register 401 transmits these loaded Q bits as fine bits to control the switches in capacitor array 406. The Q fine bits open an N−1 number of switches in capacitor array 406 and close a (Q−N+1) number of switches 211-216, etc. in capacitor array 406. The Q fine bits from register 401 cause an N−1 number of fine capacitors to be decoupled from node 202 and a (Q−N+1) number of fine capacitors to be coupled to node 202. Because N fine capacitors have the same or about the same capacitance as one coarse capacitor, coupling one additional coarse capacitor to node 202 and decoupling a N−1 number of fine capacitors from node 202 increases the total capacitance at node 202 by about $C_F$, causing the phases and the frequencies of the output clock signal CLKOUT and the feedback signal FBCLK to decrease.

For example, if the calibration number N is measured to be 30 and Q equals 100, then register 404 stores 29 zero bits and 71 one bits. In this example, capacitor array 406 causes 29 switches to be open and 71 switches to be closed in response to receiving the Q bits from register 401 after the carry signal is asserted. As a result, 29 fine capacitors are decoupled from node 202 and 71 fine capacitors are coupled to node 202.

If the UP signal continues to be asserted after the C1 signal has been asserted, then one bits continue to be serially shifted into register 401. When all Q bits stored in register 401 are one bits, the C1 signal is asserted again. In response to the C1 signal being asserted, the Q bits transmitted from carry register 404 are again stored in register 401. Capacitor array 406 resets the conductive states of its switches according to the logic states of the Q bits transmitted from registers 404 and 401, as described above.

Also, an additional one bit is serially shifted into register 402 after the C1 signal is asserted. The additional one bit stored in register 402 closes a switch in capacitor array 407 coupling an additional coarse capacitor to node 202. If the UP signal continues to be asserted, this process repeats, until all of the bits stored in register 402 are one bits, and all of the capacitors in array 407 are coupled to node 202.

Another example of the operation of registers 401-402 is now described using the assumption that all of the capacitors in array 406 and array 407 are initially coupled to node 202. When the DN signal is asserted, a zero bit is serially shifted into fine shift register 401 in each clock period of the clock signal. The number of one bits stored in fine shift register 401 decreases, and the number of zero bits stored in fine shift register 401 increases during each period of the clock signal that the DN signal is asserted. Increasing the number of zero bits stored in register 401 by one causes an additional fine capacitor to be decoupled from node 202, decreasing the capacitance at node 202. When the capacitance at node 202 decreases, the phases and the frequencies of the output clock signal CLKOUT and the feedback signal FBCLK increase (i.e., logic state transitions occur earlier in time).

If the DN signal continues to be asserted, more zero bits are serially shifted into fine shift register 401. If the DN signal continues to be asserted after all of the bits stored fine shift register 401 are zero bits, register 401 asserts the B1 borrow signal. The B1 borrow signal is transmitted to coarse shift register 402. In response to the B1 signal being asserted, a zero bit is serially shifted into coarse shift register 402. The zero bit shifted into register 402 opens a switch in capacitor array 407 decoupling a coarse capacitor from node 202.

Also, when the B1 signal is asserted, fine shift register 401 loads the Q inverted digital signals that are transmitted from register 405, and then register 401 transmits these loaded Q inverted digital signals as Q fine bits to capacitor array 406 to control switches 211-216, etc. The Q fine bits close an N−1 number of switches in capacitor array 406 and open a (Q−N+1) number of switches in capacitor array 406. The Q fine bits from register 401 cause an N−1 number of fine capacitors to be coupled to node 202 and a (Q−N+1) number of fine capacitors to be decoupled from node 202. Because N fine capacitors have the same or about the same capacitance as one coarse capacitor, decoupling one additional coarse capacitor from node 202 and coupling a N−1 number of fine capacitors to node 202 decreases the total capacitance at node 202 by about $C_F$, causing the phases and the frequencies of the output clock signal CLKOUT and the feedback signal FBCLK to increase.

For example, if the calibration number N is measured to be 40, and if Q equals 100, then borrow register 405 stores 39 one bits and 61 zero bits. In this example, capacitor array 406 causes 39 switches to be closed and 61 switches to be open in response to receiving the Q fine bits from register 401. As a result, 39 fine capacitors are coupled to node 202, and 61 fine capacitors are decoupled from node 202.

If the DN signal continues to be asserted, then zero bits continue to be serially shifted into register 401. After all of the bits stored in register 401 are zero bits, the B1 borrow signal is asserted again, the Q inverted digital signals are stored in register 401 as the fine bits, and an additional zero bit is serially shifted into register 402. Capacitor array 406 adjusts the conductive states of switches 211-216, etc. according to the logic states of the Q fine bits, as described above. The additional zero bit stored in register 402 opens a switch in capacitor array 407 decoupling an additional coarse capacitor from node 202. If the DN signal continues to be asserted, this process repeats, until all of the bits stored in register 402 are zero bits, and all of the capacitors in array 407 are decoupled from node 202.

Further details of the operation of a digitally controlled oscillator and a digital loop filter are described in commonly-assigned, co-pending U.S. patent application Ser. No. 12/272,266, filed Nov. 17, 2008, which is incorporated by reference herein in its entirety.

Figure 5:
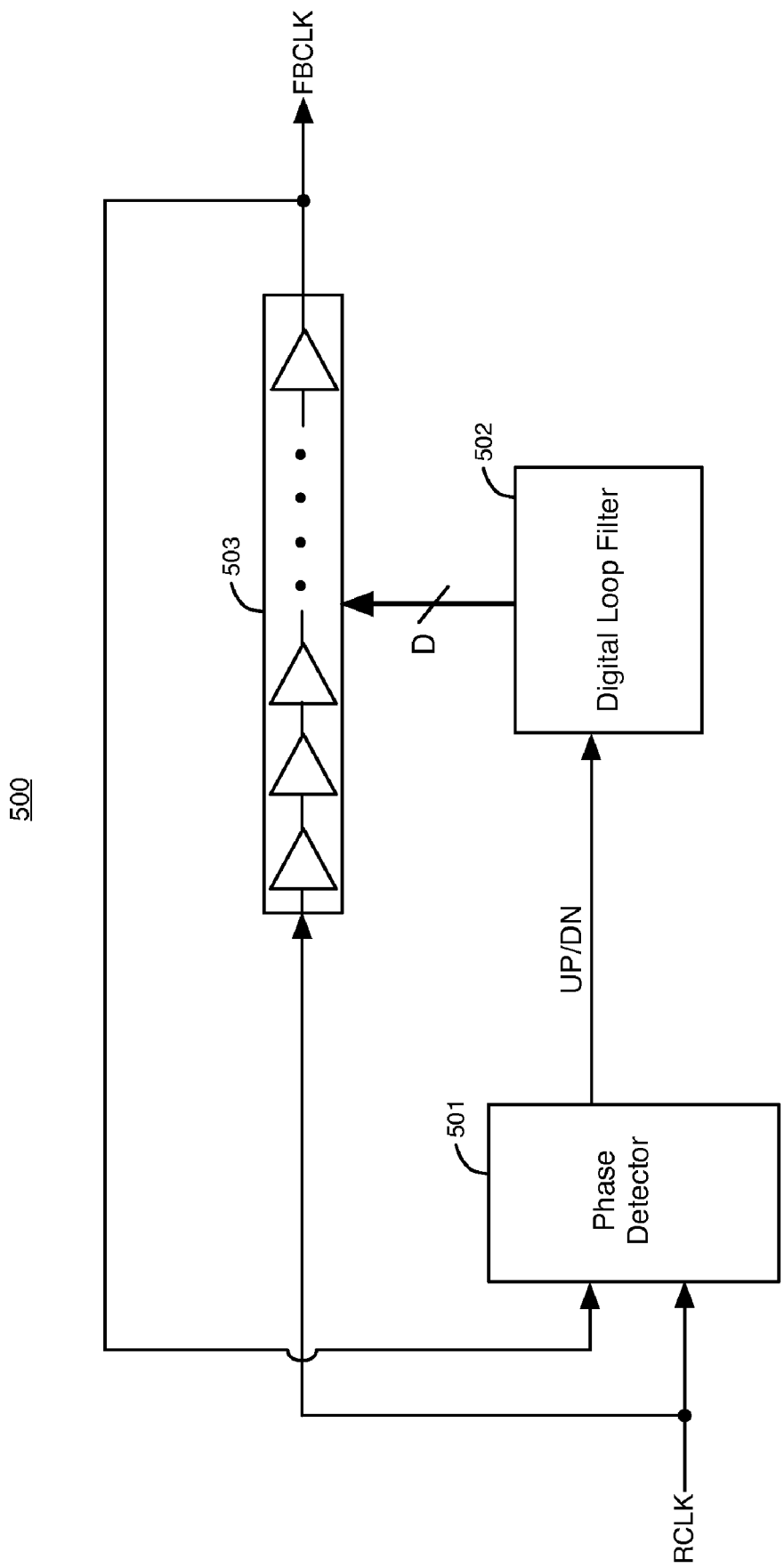
FIG. 5 illustrates an example of a digitally controlled delay-locked loop (DLL) circuit, according to an embodiment of the present invention.

Various techniques of the present invention can also be applied to digital loop filters and delay chains in delay-locked loop circuits, particularly in digitally controlled delay-locked loop circuits. FIG. 5 illustrates an example of a digitally controlled delay-locked loop (DLL) circuit 500, according to an embodiment of the present invention. DLL 500 includes phase detector 501, digital loop filter 502, and delay chain 503. Delay chain 503 receives a periodic reference clock signal (RCLK) at an input terminal. Delay chain 503 delays RCLK to generate a periodic feedback clock signal (FBCLK) at an output terminal.

Phase detector 501 receives the reference clock signal RCLK at a first input terminal. The feedback clock signal FBCLK from delay chain 503 is transmitted to a second input terminal of phase detector 501. Phase detector 501 compares the phases of the reference clock signal RCLK and the feedback clock signal FBCLK to generate one or more digital output signals UP/DN that vary in response to changes in the difference in phase between RCLK and FBCLK.

The output signals UP/DN of phase detector 501 are transmitted to one or more input terminals of digital loop filter 502. Loop filter 502 generates a set of D digital signals that are transmitted to delay chain 503 in response to the UP/DN signals. When the phase of FBCLK is ahead of the phase of RCLK, DLL 500 increases the delay of delay chain 503, causing the phase of the FBCLK signal to occur later in time. When the phase of FBCLK is behind of the phase of RCLK, DLL 500 decreases the delay of delay chain 503, causing the phase of the FBCLK signal to occur earlier in time.

Figure 6:
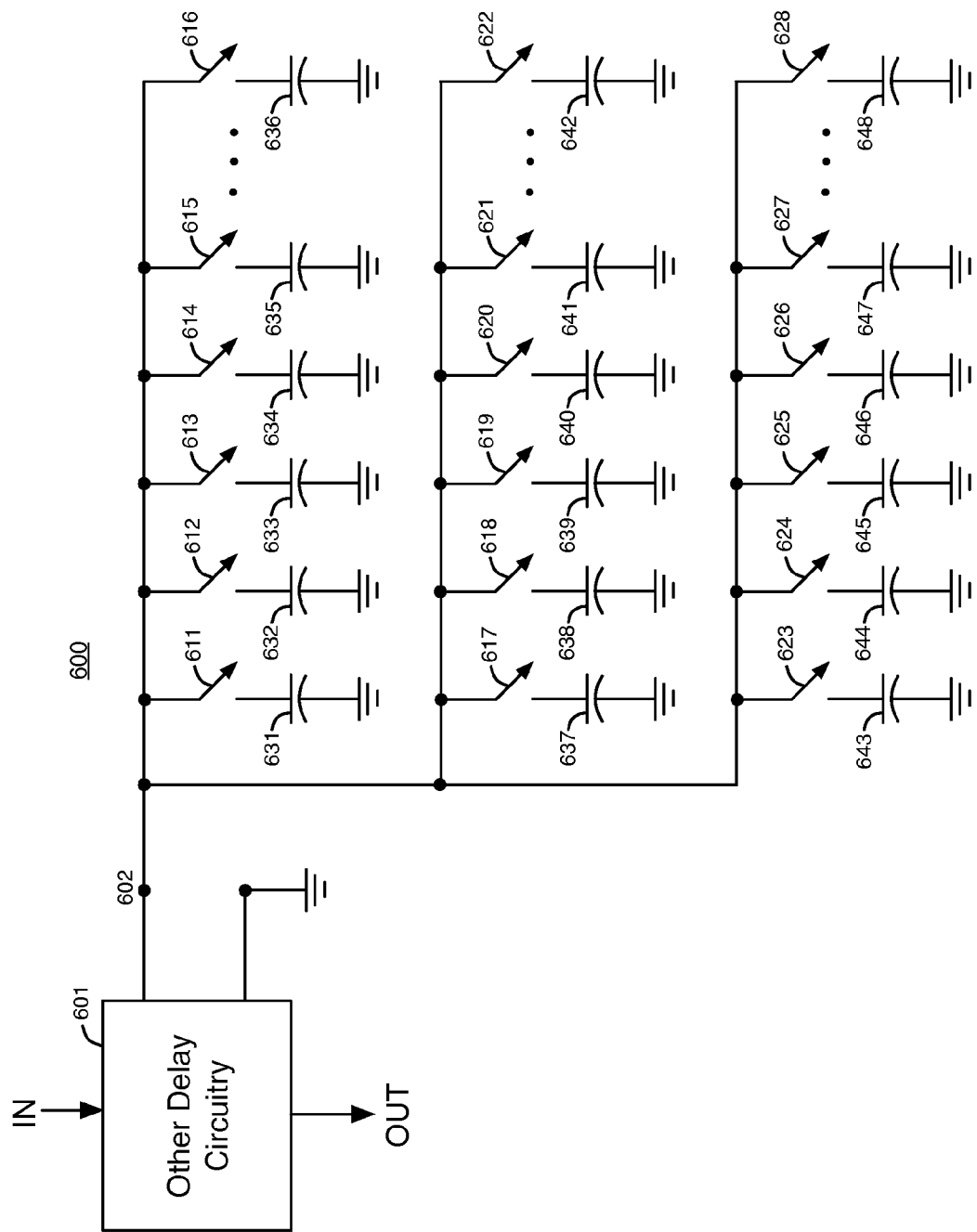
FIG. 6 illustrates an example of a delay circuit in the delay chain of a digital delay-locked loop that has a variable capacitance at a node, according to an embodiment of the present invention.

FIG. 6 illustrates an example of a delay circuit in the delay chain of a digitally controlled delay-locked loop, according to an embodiment of the present invention. Delay circuit 600 shown in FIG. 6 delays an input clock signal IN to generate a delayed output clock signal OUT. Delay circuit 600 has switches including switches 611-628 and capacitors including capacitors 631-648. Each capacitor 631-648 is coupled between a corresponding switch 611-628 and a terminal that receives a ground voltage. Capacitors 631-636 are fine capacitors, and capacitors 637-648 are coarse capacitors. Each of the coarse capacitors 637-648 has a larger capacitance than each of the fine capacitors 631-636.

One terminal of each of the switches 611-628 is coupled to a node 602 in the other delay circuitry 601. The other delay circuitry 601 may include, e.g., a number of inverters coupled together in series to delay OUT relative to IN. Delay circuit 600 is an example of the architecture of each of the delay circuits in delay chain 503 that delay FBCLK relative to the phase of RCLK. The delay circuits 600 in delay chain 503 are coupled together in series.

Node 602 is coupled in the delay path between the IN and OUT clock signals. For example, node 602 may be located between the output terminal of one inverter and the input terminal of the next inverter.

The D digital control signals generated by loop filter 502 control the conductive states of switches 611-628. Each of the D digital control signals causes one of the switches 611-628 to be opened or closed. Closing one of the switches causes a corresponding capacitor to be coupled to node 602. Opening one of the switches causes a corresponding capacitor to be decoupled from node 602. The D digital control signals from filter 502 control switches coupled to fine and coarse capacitors in each of the delay circuits 600 in delay chain 503.

Loop filter 502 adjusts the delay of delay chain 503 in discrete increments of time by varying the total capacitance at node 602. For example, the D digital control signals may open one of switches 611-616 to decouple an additional fine capacitor from node 602, thereby decreasing the delay provided to FBCLK relative to RCLK. As another example, the D digital control signals may close one of switches 611-616 to couple an additional fine capacitor to node 602, thereby increasing the delay provided to FBCLK relative to RCLK. When all of switches 611-616, etc. are closed, the delay provided to FBCLK can be further increased by closing one of switches 617-628 and opening a N−1 number of switches 611-616, etc., where N is the calibration number. As with the PLL embodiment, the calibration number equals the number of fine capacitors having a combined capacitance when coupled in parallel that most closely matches the capacitance of one coarse capacitor.

The calibration number can be determined, e.g., using one of the measurement techniques shown in and described above with respect to FIGS. 3A-3B by using delay chain 503 as DUT 304. The delay chain can be configured as an element in a ring oscillator (i.e., by coupling a feedback loop around it). This configuration is used only during the calibration phase. Once it is configured as an oscillator, it takes the place of the DCO (DUT).

The calibration number N can be used to adjust the D digital control signals to decouple a N−1 number of fine capacitors from node 602 when a coarse capacitor is coupled to node 602. The calibration number N can also be used to adjust the D digital control signals to couple a N−1 number of fine capacitors to node 602 when a coarse capacitor is decoupled from node 602, as discussed above with respect to FIG. 4.

According to another embodiment, DCO 200 or delay chain 600 can have three different types of segmented capacitors including fine capacitors 231-236 (or 631-636), medium capacitors 237-242 (or 637-642), and large capacitors 243-248 (or 643-648). Each of the medium capacitors has a larger capacitance than each of the fine capacitors. Each of the large capacitors has a larger capacitance than each of the medium capacitors. Bits stored in register 401 control switches coupled to the fine capacitors as discussed above. In this embodiment, bits stored in coarse register 402 control switches coupled to the medium capacitors, and bits stored in a third shift register control switches coupled to the large capacitors. The measurement circuitry and techniques of FIG. 3A or 3B can be used to determine a number K of the medium capacitors having a combined capacitance that most closely equals a capacitance of one of the large capacitors. The first control signals CS1 couple a selected number of medium capacitors to node 202 (or 602), and the second control signals CS2 couple a single large capacitor to node 202 (or 602). The number K is used to decouple K−1 of the medium capacitors from node 202 (or 602) when one of the large capacitors is coupled to node 202 (or 602). The number K is also used to couple K−1 of the medium capacitors to node 202 (or 602) when one of the large capacitors is decoupled from node 202 (or 602).

Figure 7:
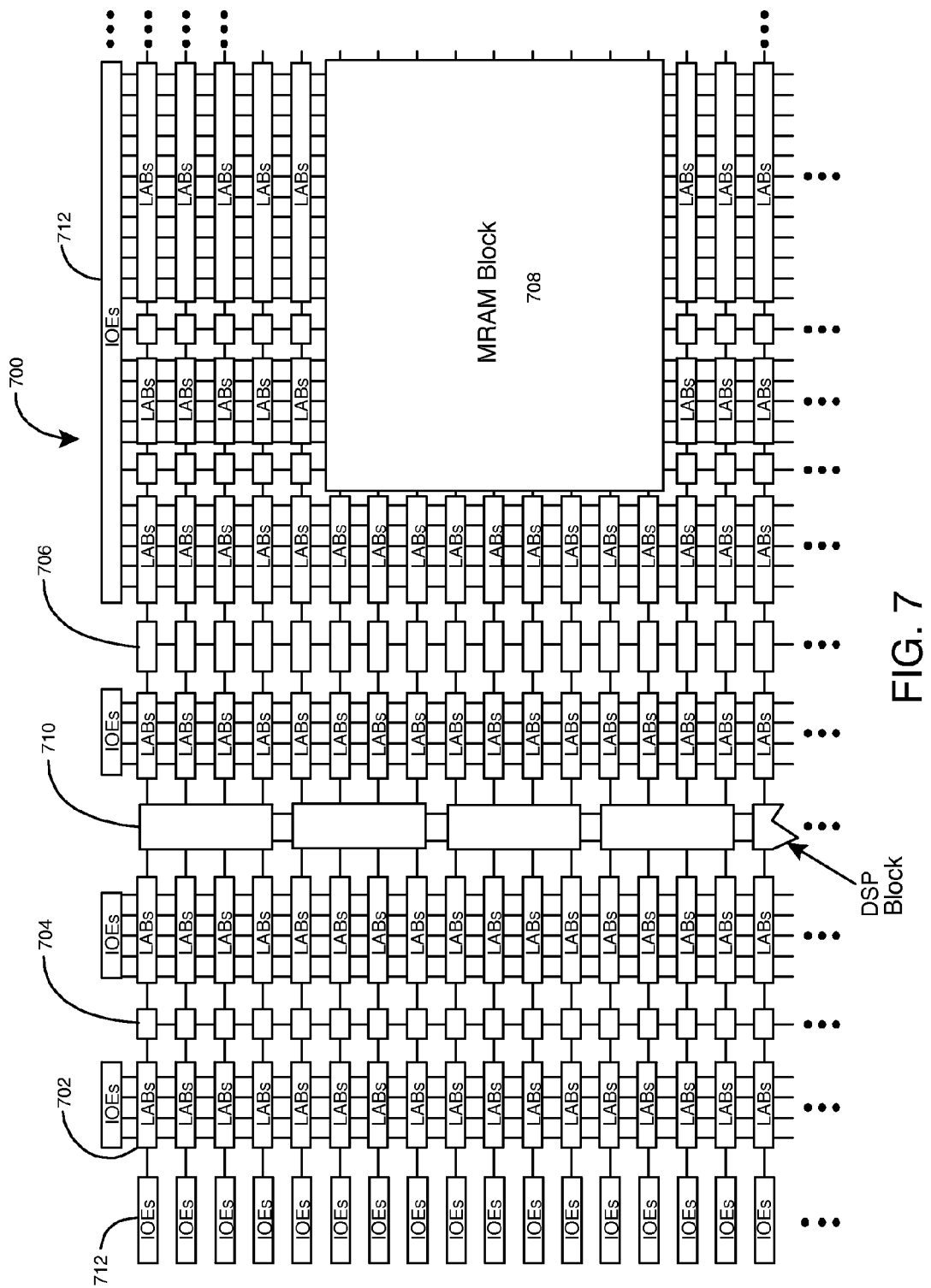
FIG. 7 is a simplified partial block diagram of a field programmable gate array (FPGA) that can include aspects of the present invention.

FIG. 7 is a simplified partial block diagram of a field programmable gate array (FPGA) 700 that can include aspects of the present invention. FPGA 700 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 700 includes a two-dimensional array of programmable logic array blocks (or LABs) 702 that are interconnected by a network of column and row interconnect conductors of varying length and speed. LABs 702 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 700 also includes a distributed memory structure including random access memory (RAM) blocks of varying sizes provided throughout the array. The RAM blocks include, for example, blocks 704, blocks 706, and block 708. These memory blocks can also include shift registers and first-in-first-out (FIFO) buffers.

FPGA 700 further includes digital signal processing (DSP) blocks 710 that can implement, for example, multipliers with add or subtract features. Input/output elements (IOEs) 712 located, in this example, around the periphery of the chip, support numerous single-ended and differential input/output standards. IOEs 712 include input and output buffers that are coupled to pads of the integrated circuit. The pads are external terminals of the FPGA die that can be used to route, for example, input signals, output signals, and supply voltages between the FPGA and one or more external devices. It is to be understood that FPGA 700 is described herein for illustrative purposes only and that the present invention can be implemented in many different types of PLDs, FPGAs, and ASICs.

Figure 8:
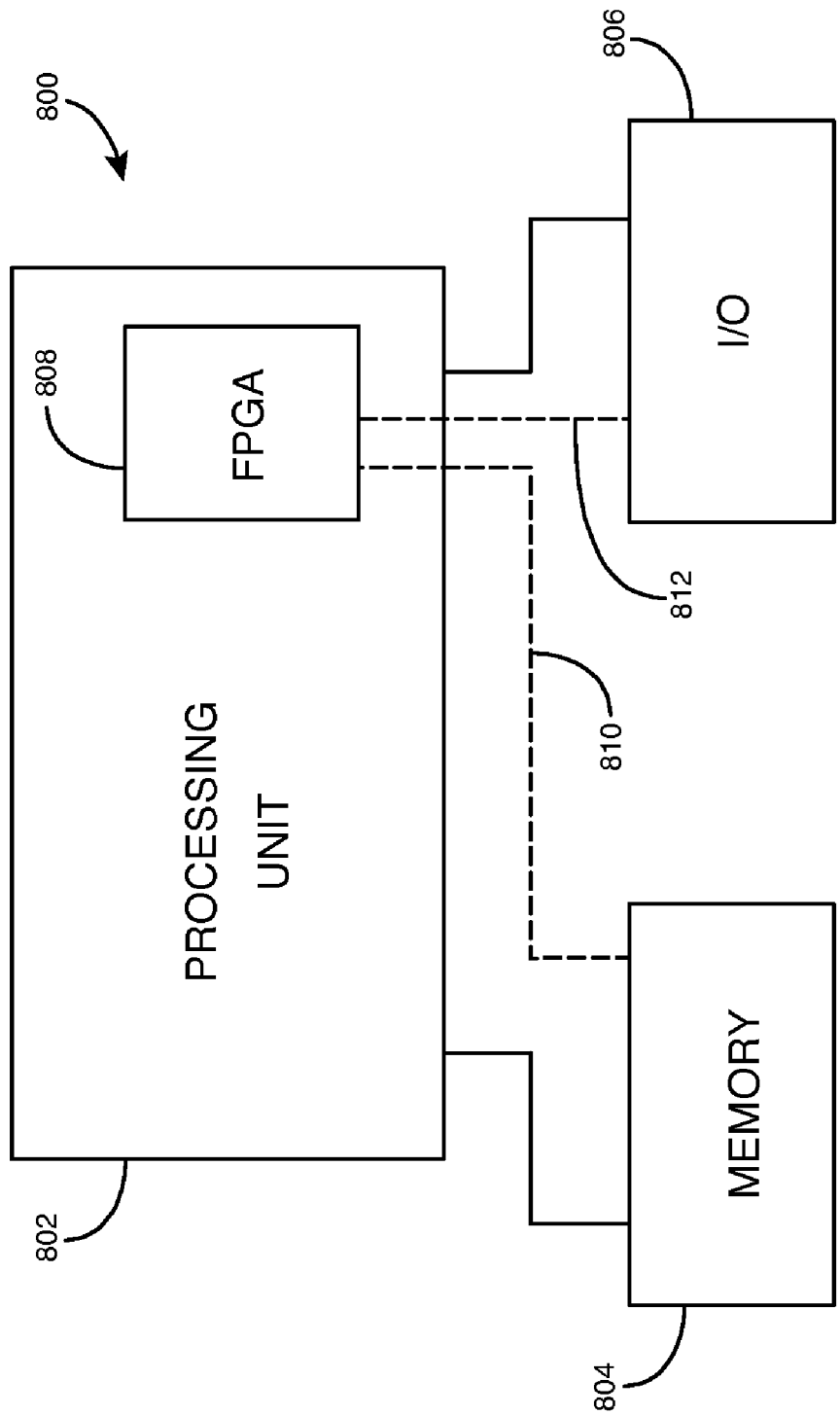
FIG. 8 shows a block diagram of an exemplary digital system that can embody techniques of the present invention.

The present invention can also be implemented in a system that has an FPGA as one of several components. FIG. 8 shows a block diagram of an exemplary digital system 800 that can embody techniques of the present invention. System 800 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 800 can be provided on a single board, on multiple boards, or within multiple enclosures.

System 800 includes a processing unit 802, a memory unit 804, and an input/output (I/O) unit 806 interconnected together by one or more buses. According to this exemplary embodiment, an FPGA 808 is embedded in processing unit 802. FPGA 808 can serve many different purposes within the system of FIG. 8. FPGA 808 can, for example, be a logical building block of processing unit 802, supporting its internal and external operations. FPGA 808 is programmed to implement the logical functions necessary to carry on its particular role in system operation. FPGA 808 can be specially coupled to memory 804 through connection 810 and to I/O unit 806 through connection 812.

Processing unit 802 can direct data to an appropriate system component for processing or storage, execute a program stored in memory 804, receive and transmit data via I/O unit 806, or other similar functions. Processing unit 802 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 808 can control the logical operations of the system. As another example, FPGA 808 acts as a reconfigurable processor, which can be reprogrammed as needed to handle a particular computing task. Alternatively, FPGA 808 can itself include an embedded microprocessor. Memory unit 804 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. An apparatus comprising:
   phase detection circuitry that generates control signals in response to an input clock signal and a feedback clock signal;
   a clock signal generation circuit comprising fine and coarse capacitors, the clock signal generation circuit changing a capacitance of the fine and the coarse capacitors that are affecting an output clock signal in response to a change in the control signals; and
   measurement circuitry that determines a calibration number of the fine capacitors having a combined capacitance that most closely matches a capacitance of one of the coarse capacitors.

2. The apparatus defined in claim 1 wherein a number of the fine capacitors affecting the output clock signal is based on the calibration number when a number of the coarse capacitors affecting the output clock signal changes.

3. The apparatus defined in claim 1 wherein the apparatus is configured to increase a capacitance at a node in the clock signal generation circuit to decrease a phase of the output clock signal by coupling one of the coarse capacitors to the node and decoupling one less than the calibration number of the fine capacitors from the node, and
   wherein the apparatus is configured to decrease a capacitance at the node in the clock signal generation circuit to increase the phase of the output clock signal by decoupling one of the coarse capacitors from the node and coupling one less than the calibration number of the fine capacitors to the node.

4. The apparatus defined in claim 1 wherein the apparatus is a phase-locked loop, the clock signal generation circuit is a digitally controlled oscillator circuit, and the phase-locked loop further comprises a frequency divider that generates the feedback clock signal in response to the output clock signal.

5. The apparatus defined in claim 1 wherein the apparatus is a delay-locked loop, the clock signal generation circuit is a delay chain, and the feedback clock signal and the output clock signal are the same signal.

6. The apparatus defined in claim 1 wherein each of the coarse capacitors has a larger capacitance than each of the fine capacitors.

7. The apparatus defined in claim 1 wherein the phase detection circuitry comprises a phase detector and a digital loop filter coupled to the phase detector.

8. The apparatus defined in claim 1 wherein the apparatus is a circuit fabricated on a programmable logic integrated circuit.

9. The apparatus defined in claim 1 wherein the measurement circuitry comprises a time base circuit that generates an oscillating signal and a counter circuit that counts a first number of periods in the output clock signal in a first half of each period of the oscillating signal when a selected number of the fine capacitors are affecting a phase of the output clock signal, and wherein a counter circuit counts a second number of periods in the output clock signal in a second half of each period of the oscillating signal when only one of the coarse capacitors is affecting a phase of the output clock signal.

10. The apparatus defined in claim 1 wherein the phase detection circuitry and the clock signal generation circuit are coupled in a feedback loop.

11. The apparatus defined in claim 1 wherein the measurement circuitry is fabricated on a first integrated circuit and the phase detection circuitry and the clock signal generation circuit are fabricated on a second integrated circuit.

12. A circuit comprising:
    phase detection circuitry that generates control signals in response to an input clock signal and a feedback clock signal; and
    a clock signal generation circuit comprising fine and coarse capacitors, the clock signal generation circuit changing a capacitance of the fine and the coarse capacitors that are affecting an output clock signal in response to a change in the control signals,
    wherein a measurement circuit determines a calibration number of the fine capacitors having a combined capacitance that most closely matches a capacitance of one of the coarse capacitors, and a number of the fine capacitors affecting the output clock signal is based on the calibration number when a number of the coarse capacitors affecting the output clock signal changes.

13. The circuit defined in claim 12 wherein the phase detection circuitry comprises a register circuit that stores signals generated based on the calibration number.

14. The circuit defined in claim 12 wherein the circuit is configured to increase a capacitance at a node in the clock signal generation circuit to increase a delay in the output clock signal by coupling one of the coarse capacitors to the node and decoupling one less than the calibration number of the fine capacitors from the node using signals stored in a first storage circuit, and
    wherein the circuit is configured to decrease a capacitance at the node in the clock signal generation circuit to decrease the delay in the output clock signal by decoupling one of the coarse capacitors from the node and coupling one less than the calibration number of the fine capacitors to the node using signals stored in a second storage circuit.

15. The circuit defined in claim 12 wherein the circuit is a phase-locked loop, the clock signal generation circuit is a digitally controlled oscillator circuit, and the phase-locked loop further comprises a frequency divider that generates the feedback clock signal in response to the output clock signal.

16. The circuit defined in claim 12 wherein the circuit is a delay-locked loop, and the clock signal generation circuit is a delay chain.

17. The circuit defined in claim 12 wherein the measurement circuit comprises a time base circuit that generates an oscillating signal and a counter circuit that counts a first number of periods in the output clock signal in one half of each period of the oscillating signal when a selected number of the fine capacitors is affecting the output clock signal, and wherein a counter circuit counts a second number of periods in the output clock signal in another half of each period of the oscillating signal when only one of the coarse capacitors is affecting the output clock signal.

18. A method for generating a periodic signal, the method comprising:
- comparing phases of a periodic input signal and a periodic feedback signal to generate control signals;
- varying a capacitance of fine and coarse capacitors that are affecting a phase of a periodic output signal in response to changes in the control signals; and
- determining a calibration number of the fine capacitors that have a combined capacitance most closely matching a capacitance of one of the coarse capacitors.

19. The method defined in claim 18 wherein varying the capacitance of the fine and coarse capacitors that are affecting the phase of the periodic output signal in response to changes in the control signals further comprises increasing a capacitance at a node to increase a delay in a phase of the periodic output signal by coupling one of the coarse capacitors to the node and decoupling one less than the calibration number of the fine capacitors from the node, and decreasing a capacitance at the node to decrease a delay in the phase of the periodic output signal by decoupling one of the coarse capacitors from the node and coupling one less than the calibration number of the fine capacitors to the node.

20. The method defined in claim 18 wherein determining the calibration number of the fine capacitors that have a combined capacitance most closely matching a capacitance of one of the coarse capacitors further comprises counting a first number of periods in the periodic output signal in one half of each period of an oscillating signal when a selected number of the fine capacitors is affecting a phase of the periodic output signal, and counting a second number of periods in the periodic output signal in another half of each period of the oscillating signal when only one of the coarse capacitors is affecting a phase of the periodic output signal.

* * * * *